(12) United States Patent
Shin

(10) Patent No.: US 7,023,025 B2
(45) Date of Patent: Apr. 4, 2006

(54) CRYSTAL GROWTH METHOD OF NITRIDE SEMICONDUCTOR

(75) Inventor: Johngeon Shin, Seongnam-si (KR)

(73) Assignee: LG.Electronics Inc., Seoul (KR)

( * ) Notice: Subject to any disclaimer, the term of this patent is extended or adjusted under 35 U.S.C. 154(b) by 0 days.

(21) Appl. No.: 10/765,100

(22) Filed: Jan. 28, 2004

(65) Prior Publication Data

US 2004/0264248 A1  Dec. 30, 2004

(30) Foreign Application Priority Data

Jan. 29, 2003  (KR) .................. 10-2003-0005948

(51) Int. Cl.
*H01L 33/00* (2006.01)

(52) U.S. Cl. .................. 257/103; 257/79; 257/94; 257/96; 427/255.28

(58) Field of Classification Search .................. 257/94, 257/96, 79; 427/255.28
See application file for complete search history.

(56) References Cited

U.S. PATENT DOCUMENTS

2002/0125491 A1 * 9/2002 Shibata et al.
2002/0192373 A1 * 12/2002 Sone et al.

* cited by examiner

*Primary Examiner*—Mai-Huong Tran
(74) *Attorney, Agent, or Firm*—Birch, Stewart, Kolasch & Birch, LLP

(57) ABSTRACT

The present invention relates to a method of manufacturing a nitride semiconductor, and, more particularly, a crystal growth method of a nitride semiconductor wherein a nitride semiconductor are grown on a nitride buffer layer including aluminums so that it is possible to improve electrical and crystalline characteristics.

7 Claims, 1 Drawing Sheet

CRYSTAL GROWTH METHOD OF NITRIDE SEMICONDUCTOR

TECHNICAL FIELD

This Nonprovisional application claims priority under 35 U.S.C. § 119(a) on Patent Application No. 10-2003-0005948 filed in KOREA on Jan. 29, 2003, the entire contents of which are hereby incorporated by reference.

The present invention relates to a method of manufacturing a nitride semiconductor, and, more particularly, a crystal growth method of a nitride semiconductor wherein a nitride semiconductor is grown on a nitride buffer layer including aluminum so that it is possible to improve electrical and crystalline characteristics.

BACKGROUND OF THE INVENTION

Photoelectric elements and electric elements using Group III–V nitride semiconductors are developed actively. Luminescence diode and a laser diode with ultraviolet range or visible range are applied to many fields and their application will be extended more widely in the near future.

It is difficult to grow a nitride semiconductor film and elements of a good quality since nitride substrate of a mono-crystal having a good character is hard to make.

So, conventionally, the nitrides were grown on double-substrates of such as GaAs, ZnO, Sapphire, SiC, etc. Among them, nitride films grown on Sapphire substrate and SiC have specially a good quality enough to be used widely for manufacturing elements.

SiC has a good electric conductivity but very expensive so that most elements are using the nitrides grown on substrate of Sapphire.

Improving the characteristics of the films of the nitride semiconductors is due to the development of growth technology of the nitrides.

In order to grow a nitride film on upper substrate of Sapphire, the Sapphire substrate has to be treated at a high temperature, and then buffer layer is made on it at a low temperature (450~600° C.). After that, the nitride film is grown on the buffer layer at a high temperature.

During this process, buffer layer growth is important.

FIG. 1 is shown a cross-sectional view of the stacking structure including the nitride semiconductors grown as a conventional method of crystal growth, which comprise the process of growing the buffer layer of the bivalent nitride (11) on the upper substrate of sapphire (10) and the process of growing the layers of the nitride semiconductor (12) on said Group-2 nitride buffer layers.

The necessity of the buffer layer is due to the difference between thermal expansion and the lattice constant of a sapphire substrate and the nitride which grows on the sapphire substrate (10). Namely, to overcome the differences of the thermal expansion and the lattice constant between the nitrides and the sapphire substrate (10), the nitride semiconductor (12) is grown after the layer of bivalent nitride (11) which is selected from GaN, AlN, InN and SiNx or the compounds thereof, is grown on a sapphire substrate (10), as shown FIG. 1.

The nitride film which was grown like the above is not single crystal but polymer or poly crystal so that it can be a seed layer to be able to grow a layer of the nitride compound semiconductor Using the conventional single buffer layers of such like said GaN, AlN, InN, SiNx, etc., makes the nitride film with an improved characteristics in crystallographical view, but still has lots of problem to overcome the different physical characteristics between sapphire and GaN.

Therefore, in order to get a nitride semiconductor layer with the improved crystalline characteristics a new growth method or development of a new buffer layer is necessary, and this is the core for the improved function of the final product, i.e., elements.

In order to solve the said problems, the present invention provides a method of manufacturing of nitride semiconductor layer with improved electrical and crystalline characteristics by growth the nitride semiconductors on upper substrate of the nitride buffer layer which includes the aluminum.

The present invention provides a method of manufacturing of nitride semiconductor layer comprising: a first step of growing a buffer layer including aluminum on the top of sapphire substrate; a second step of growing bivalent nitride buffer layers on the top of said nitride buffer layers including aluminum; and a third step of growing a nitride semiconductor on the top of said bivalent nitride buffer layers.

SUMMARY OF THE INVENTION

An object of the present invention is to provide A nitride semiconductor comprising a metal oxide layer, said metal, formed on said metal oxide layer, a second nitride buffer layer formed on said first nitride buffer layer, and a nitride layer formed on said nitride buffer layers.

Another object of the present invention is to provide the nitride semiconductor wherein said metal oxide layer is a sapphire substrate and said metal is aluminum.

Further object of the present invention is to provide the nitride semiconductor, wherein said first and second nitride buffer layers include Indium.

According to an aspect of the present invention, the nitride semiconductor, wherein said second nitride buffer layer is a bivalent nitride layer.

According to another aspect of the present invention, the nitride semiconductor, wherein said third nitride buffer layer which does not include said metal, is formed between said first nitride buffer layer and said second nitride buffer.

DETAILED DESCRIPTION

Basic idea of the present invention is to make a smooth conversion from sapphire substrate($Al_2O_3$) to nitride semiconductor layer by growing the nitride buffer layer ($Al_xGa_yIn_zN$, $0<x\leq1$, $0\leq y\leq1$, $0\leq z\leq1$) including aluminum, rather than the conventional single layer of bivalent buffer (AlN, GaN, InN, SiNx), first on sapphire substrate, and then growing a nitride semiconductor layer on the buffer layer. This can make good crystalline characteristic of the nitride semiconductor layer.

Moreover, as shown the second embodiment below, the nitride buffer layer(the $Ga_xIn_yN$ and 0 x 1, 0 y 1) not including the aluminum (Al) and bivalent nitride buffer layer is grown additionally on nitride buffer layer including aluminum, and the nitride semiconductor layer can be grown thereon.

Figure 1:
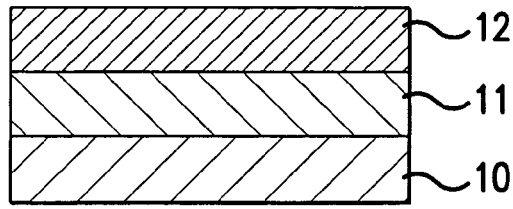
FIG. 1 is a cross-sectional view of nitride semiconductor layer grown as a conventional crystal growth method.
Figure 2:
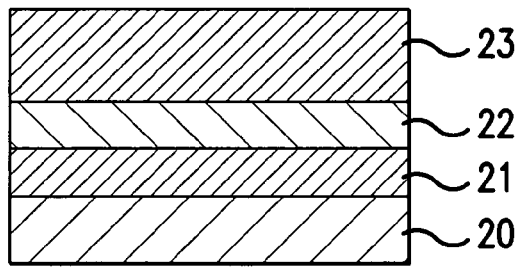
FIG. 2 is a cross-sectional view of nitride semiconductor layer grown as first embodiment of the present invention.

FIG. 2 is a cross-sectional view of a stacking structure of the nitride semiconductor layer grown by the crystal growth method following the first embodiment of the present invention. The nitride buffer layer (21) is grown on the top of the sapphire substrate (20) and then a bivalent nitride buffer layer (22) is grown on the nitride buffer layer (21) including aluminum. After that, a nitride semiconductor (23) is grown on the top of the bivalent nitride buffer layer (22).

$Al_xGa_yIn_zN$ ($0<x\leqq1$, $0\leqq y\leqq1$, $0\leqq z\leqq1$) is preferred for the nitride buffer layer including aluminum (21) and the layer of one selected from AlN, GaN, InN and SiNx is preferred for bivalent nitride buffer layer.

And preferably, the last nitride semiconductor layer is GaN layer.

Also, preferably, the nitride buffer layer(21) including aluminum and bivalent nitride buffer layer(22) are grown at the condition of 400~600° C. to have thickness of 10–1000 Å.

The effect for adding Indium (In) at the buffer layer is to complement the nitrides having high hardness relatively (because In is ductile) and also to hinder generating dislocation and electric wave.

The reason of adding a buffer layer including aluminum on the sapphire substrate is as follows: the sapphire substrate has its surface wherein in some part oxygen is replaced with Nitrogen through nitrification. That is, by growing nitride buffer layer including the aluminum on the sapphire substrate, the progressive conversion from the sapphire substrate(Al2O3) to nitride layer can be induced.

Figure 3:
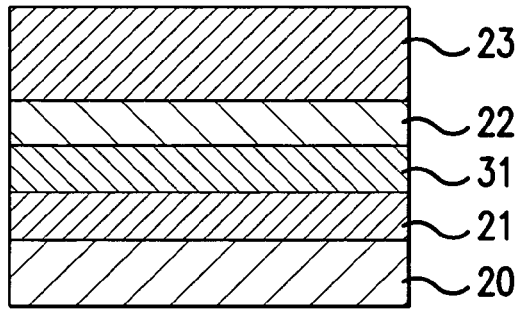
FIG. 3 is a cross-sectional view of nitride semiconductor layer grown as second embodiment of the present invention.

FIG. 3 is a cross-sectional view of nitride semiconductor layer by the crystal growth method following the second embodiment of the present invention, wherein the nitride buffer layer not including aluminum (31) is added between nitride buffer layer including aluminum (21) and bivalent nitride buffer layer (22) of the first embodiment of the invention.

Preferably, nitride buffer layer not including aluminium (31) is $Ga_xIn_yN$ layer ($0\leqq x\leqq1$, $0\leqq y\leqq1$).

Preferably, the nitride buffer layer not including aluminium (31) is grown at the condition of 400~600° C. to have thickness of 10–1000 Å.

The reason that the buffer layer of not including the aluminum is grown on the buffer layer including the aluminum, and that GaN buffer layer is grown on the said buffer layer not including aluminum, is for making physical conversion to final GaN layer easy.

That is, GaN epi-layer is grown from sapphire substrate through AlGaInN layer, GaInN layer and a GaN buffer layer, so that this minimizes the difference of physical quality such as a coefficient of the thermal expansion and the lattice constant, between sapphire substrate and GaN layer.

Figure 4:
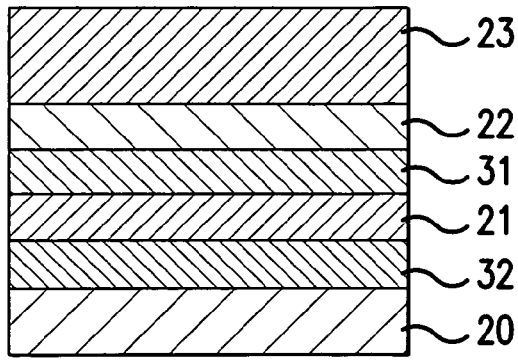
FIG. 4 is a cross-sectional view of nitride semiconductor layer grown as third embodiment of the present invention.

FIG. 4 is a cross-sectional view of a stacking structure of the nitride semiconductor layer grown by crystal growth method following the third embodiment of the present invention. The third embodiment is comprised of adding additional nitride film (32) between nitride buffer layer including aluminum (21) and sapphire substrate (20) of the first or the second embodiment. The nitride film is formed sapphire substrate (20) by treating sapphire substrate (20) at the high temperature and letting ammonia(NH3) flow thereon.

It is examined by shooting x-rays at the nitride semiconductor grown by the crystal growth method of the present invention, measuring an electrical and crystalline characteristics.

The GaN layer which is a nitride semiconductor layer grown by crystal growth method of the present invention, has the improved FWHM of approximately 10%~15% compared with single buffer layer such like AlN, GaN, InN and SiNx in respect of directions 002 and 102 of the wave length which is measured in x-rays investigation.

In addition, a carrier mobility of GaN layer grown by the crystal growth method of the present invention is improved by 50% at maximum, and carrier density is decreased about (Mid)$10^{16}$~(High) $10^{16}$ cm$^{-3}$.

The nitride semiconductor layer grown by the crystal growth method of the present invention is improved in its electrical and crystalline characteristics than those nitride semiconductor grown by the conventional art.

INDUSTRIAL APPLICABILITY

The present invention relates to a crystal growth method of nitride semiconductor in which a nitride compound semiconductor are grown at an upper portion of the nitride compound buffer layer including aluminum so that it is possible to improve characteristics for electricity and crystallization.

The forgoing embodiments are merely exemplary and are not to be construed as limiting the present invention. The present teachings can be readily applied to other types of nitrate buffer layers. The description of the present invention is intended to be illustrative, and not to limit the scope of the claims. Many alternatives, modifications, and variations will be apparent to those skilled in the art.

What is claimed is:

1. A nitride-semiconductor comprising:
   a metal oxide layer,
   a first nitride layer which includes said metal, formed on said metal oxide layer,
   a second nitride buffer layer formed over said first nitride buffer layer,
   a third nitride buffer layer which does not include said metal, said third nitride buffer layer being formed between said first nitride buffer layer and said second nitride buffer, and
   a nitride layer formed over said nitride buffer layers.

2. The nitride semiconductor of claim 1, wherein said metal oxide layer is a sapphire substrate and said metal is aluminum.

3. The nitride semiconductor of claim 1, wherein said first and second nitride buffer layers include indium.

4. The nitride semiconductor of claim 1, wherein said second nitride buffer layer is a bivalent nitride layer.

5. The nitride semiconductor of claim 1, wherein nitride film is formed between said metal oxide layer and first nitride buffer layer.

6. The nitride semiconductor of claim 1, wherein said third nitride buffer layer as formed from $Ga_xIn_yN$ where $0\leqq x\leqq1$ and $0\leqq y\leqq1$.

7. The nitride semiconductor of claim 1, wherein said first nitride buffer layer, said second nitride buffer layer and said third nitride buffer layer each have a thickness of 10–1000 Å.

* * * * *

UNITED STATES PATENT AND TRADEMARK OFFICE
CERTIFICATE OF CORRECTION

PATENT NO.        : 7,023,025 B2                                    Page 1 of 1
APPLICATION NO. : 10/765100
DATED             : April 4, 2006
INVENTOR(S)       : Johngeon Shin It is certified that error appears in the above-identified patent and that said Letters Patent is hereby corrected as shown below:

TITLE PAGE, ITEM (73)
The assignee name reading "LG. Electronics Inc." should read -- LG Electronics Inc.--

Signed and Sealed this

Nineteenth Day of December, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,023,025 B2 | Page 1 of 1 |
| APPLICATION NO. | : 10/765100 | |
| DATED | : April 4, 2006 | |
| INVENTOR(S) | : Johngeon Shin | |

It is certified that error appears in the above-identified patent and that said Letters Patent is hereby corrected as shown below:

Column 4, claim 1, line 3 thereof: "a first nitride layer" should read --a first nitride buffer layer--

Signed and Sealed this

Eighteenth Day of December, 2007

JON W. DUDAS
*Director of the United States Patent and Trademark Office*